United States Patent
Keshavan

(10) Patent No.: US 8,414,986 B2
(45) Date of Patent: Apr. 9, 2013

(54) METHOD OF FORMING SURFACE COATINGS ON CUTTING ELEMENTS

(75) Inventor: Madapusi K. Keshavan, The Woodlands, TX (US)

(73) Assignee: Smith International, Inc., Houston, TX (US)

( * ) Notice: Subject to any disclaimer, the term of this patent is extended or adjusted under 35 U.S.C. 154(b) by 220 days.

(21) Appl. No.: 12/613,927

(22) Filed: Nov. 6, 2009

(65) Prior Publication Data
US 2010/0108403 A1 May 6, 2010

Related U.S. Application Data

(60) Provisional application No. 61/111,996, filed on Nov. 6, 2008.

(51) Int. Cl.
*H05H 1/24* (2006.01)
(52) U.S. Cl. ............. 427/577; 427/249.1; 427/249.8; 427/255.31; 427/255.38; 427/255.394
(58) Field of Classification Search ............ 427/577, 427/249.1, 249.7, 255.31, 255.38, 255.394, 427/249.8
See application file for complete search history.

(56) References Cited

U.S. PATENT DOCUMENTS

| | | | | |
|---|---|---|---|---|
| 5,653,812 | A * | 8/1997 | Petrmichl et al. | 118/723 E |
| 6,087,025 | A * | 7/2000 | Dearnaley et al. | 428/623 |
| 6,364,662 | B1 * | 4/2002 | Kumar | 433/165 |
| 6,656,591 | B2 * | 12/2003 | Liu et al. | 428/408 |
| 2005/0139395 | A1 * | 6/2005 | Shaygan | 175/374 |
| 2009/0239078 | A1 * | 9/2009 | Asmussen et al. | 428/408 |

OTHER PUBLICATIONS

Ensinger, Wolfgang, et al., "Formation of Diamond-Like Carbon Films by Plasma-Based Ion Implantation and Their Characterization". New Diamond and Frontier Carbon Technology, vol. 16, No. 1 2006 MYU Tokyo, pp. 1-31.*
Hakovirta, M., "Adhesion of amorphous diamond-like film on sputtered hardmetal (WC-Co) cutting tools." Diamond and Related Materials 5 (1996) pp. 186-189.*
Perera, Y., et al., "Pulsed laser deposition (PLD) of diamond-like carbon (DLC) thin film on Polymethylmethacrylate (PMMA) and tool steels". Revista Latinoamericana de Metalurgia y Materiales, vol. 21, No. 1, 2001, pp. 30-34.*
Olszyna, A., et al., "Nanocrystalline diamond-like carbon coatings produced on the Si3N4-TiC composites intended for the edges of cutting tools". Thin Solid Films 459 (2004) pp. 224-227.*

* cited by examiner

*Primary Examiner* — Bret Chen
(74) *Attorney, Agent, or Firm* — Osha Liang LLP

(57) ABSTRACT

A method of forming a cutting element that includes placing at least one cutting element in an inner surface of at least one hollow tubular member such that at least a portion of the at least one cutting element is exposed; generating plasma within the hollow portion of the tubular; and depositing at least one refractory metal or $sp^3$ carbon-containing coating on an exposed surface of the at least one cutting element is disclosed.

9 Claims, 4 Drawing Sheets

METHOD OF FORMING SURFACE COATINGS ON CUTTING ELEMENTS

BACKGROUND OF INVENTION

1. Field of the Invention

Embodiments disclosed herein relate generally to coatings provided on cutting elements. In particular, embodiments disclosed herein relate generally to coatings applied by hollow cathode plasma enhanced chemical vapor deposition onto to the surface of polycrystalline diamond bodies.

2. Background Art

Polycrystalline diamond compact ("PDC") cutters have been used in industrial applications including rock drilling and metal machining for many years. In a typical application, a compact of polycrystalline diamond (PCD) (or other superhard material) is bonded to a substrate material, which is typically a sintered metal-carbide to form a cutting structure. PCD comprises a polycrystalline mass of diamonds (typically synthetic) that are bonded together to form an integral, tough, high-strength mass or lattice. The resulting PCD structure produces enhanced properties of wear resistance and hardness, making PCD materials extremely useful in aggressive wear and cutting applications where high levels of wear resistance and hardness are desired.

A PDC cutter may be formed by placing a cemented carbide substrate into the container of a press. A mixture of diamond grains or diamond grains and catalyst binder is placed atop the substrate and treated under high pressure, high temperature conditions. In doing so, metal binder (often cobalt) migrates from the substrate and passes through the diamond grains to promote intergrowth between the diamond grains. As a result, the diamond grains become bonded to each other to form the diamond layer, and the diamond layer is in turn bonded to the substrate. The substrate often comprises a metal-carbide composite material, such as tungsten carbide. The deposited diamond layer is often referred to as the "diamond table" or "abrasive layer."

An example of a drag bit for earth formation drilling using PDC cutters is shown in FIG. 1. FIG. 1 shows a rotary drill bit 10 having a bit body 12. The lower face of the bit body 12 is formed with a plurality of blades 14, which extend generally outwardly away from a central longitudinal axis of rotation 16 of the drill bit. A plurality of PDC cutters 18 are disposed side by side along the length of each blade. The number of PDC cutters 18 carried by each blade may vary. The PDC cutters 18 are individually brazed to a stud-like carrier (or substrate), which may be formed from tungsten carbide, and are received and secured within sockets in the respective blade.

Common problems that plague cutting elements and specifically cutters having an ultra hard diamond-like cutting table such as PCD, polycrystalline cubic boron nitride (PCBN), or thermally stable polycrystalline diamond (TSP) bonded on a cemented carbide substrate are chipping, spalling, partial fracturing, cracking or exfoliation of the cutting table. These problems result in the early failure of the cutting table and thus, in a shorter operating life for the cutter.

A problem known to exist with such conventional PCD materials is that they are vulnerable to thermal degradation, when exposed to elevated temperature cutting and/or wear applications, caused by the differential that exists between the thermal expansion characteristics of the interstitial solvent metal catalyst material and the thermal expansion characteristics of the intercrystalline bonded diamond. Such differential thermal expansion is known to occur at temperatures of about 400° C. and can cause ruptures to occur in the diamond-to-diamond bonding. Eventually, the ruptures can result in the formation of cracks and chips in the PCD structure, rendering the PCD structure unsuited for further use.

Another form of thermal degradation known to exist with conventional PCD materials is one that is also related to the presence of the solvent metal catalyst in the interstitial regions and the adherence of the solvent metal catalyst to the diamond crystals. Specifically, the solvent metal catalyst is known to cause an undesired catalyzed phase transformation in diamond (converting it to carbon monoxide, carbon dioxide, or graphite) with increasing temperature, thereby limiting practical use of the PCD material to about 750° C.

Attempts at addressing such unwanted forms of thermal degradation in conventional PCD materials are known in the art. Generally, these attempts have focused on the formation of a PCD body having an improved degree of thermal stability when compared to the conventional PCD materials discussed above. One known technique of producing a PCD body having improved thermal stability involves, after forming the PCD body, removing all or a portion of the solvent catalyst material therefrom.

In addition to the above-identified references that disclose treatment of the PCD body to improve the thermal stability by removing the catalyzing material from a region of the diamond body extending a minimum distance from the diamond body surface, there are other known references that disclose the practice of removing the catalyzing material from the entire PCD body. While this approach produces an entire PCD body that is substantially free of the solvent catalyst material, is it fairly time consuming. Additionally, a problem known to exist with this approach is that the lack of solvent metal catalyst within the PCD body precludes the subsequent attachment of a metallic substrate to the PCD body by solvent catalyst infiltration.

While these above-noted known approaches provide insight into diamond bonded constructions capable of providing some improved degree of thermal stability when compared to conventional PCD constructions, it is believed that further improvements in thermal stability for PCD materials useful for desired cutting and wear applications can be obtained according to different approaches that are both capable of minimizing the amount of time and effort necessary to achieve the same, and that permit formation of a thermally stable PCD construction comprising a desired substrate bonded thereto to facilitate attachment of the construction with a desired application device.

Accordingly, there exists a continuing need for PCD bodies having an improved degree of thermal stability when compared to conventional PCD materials, and that include a substrate material bonded to the PCD body to facilitate attachment of the cutting element to an application device by conventional methods such as welding or brazing and the like.

SUMMARY OF INVENTION

In one aspect, embodiments disclosed herein relate to a method of forming a cutting element that includes placing at least one cutting element in an inner surface of at least one hollow tubular member such that at least a portion of the at least one cutting element is exposed; generating plasma within the hollow portion of the tubular; and depositing at least one refractory metal or $sp^3$ carbon-containing coating on an exposed surface of the at least one cutting element.

In another aspect, embodiments disclosed herein relate to a cutting element that includes a carbide substrate; a polycrystalline diamond body attached to the carbide substrate; and a $sp^3$ carbon-containing coating bonded to the polycrystalline diamond body.

In another aspect, embodiments disclosed herein relate to a cutting element that includes a carbide substrate; a polycrystalline diamond body attached to the carbide substrate, the polycrystalline diamond body comprising a plurality of bonded diamond crystals and a plurality of interstitial regions disposed among the bonded diamond crystals; and a $sp^3$ carbon-containing coating bonded to the polycrystalline diamond body.

In yet another aspect, embodiments disclosed herein relate to a cutting element that includes a carbide substrate; a polycrystalline diamond body attached to the carbide substrate, the polycrystalline diamond body comprising a plurality of bonded diamond crystals and a plurality of interstitial regions disposed among the bonded diamond crystals, the polycrystalline diamond body further comprising: a first region of the diamond body extending a partial depth into the diamond body from at least a portion of an upper or side surface of the diamond body, the first region being substantially free of a Group VIII metal; and a second region adjacent the first region, the second region comprising the Group VIII metal; and a $sp^3$ carbon-containing coating bonded to the polycrystalline diamond body.

In yet another aspect, embodiments disclosed herein relate to a cutting element that includes a carbide substrate; a polycrystalline diamond body attached to the carbide substrate, the polycrystalline diamond body comprising a plurality of bonded diamond crystals and a plurality of interstitial regions disposed among the bonded diamond crystals, the interstitial regions being substantially free of a Group VIII metal; and a $sp^3$ carbon-containing coating bonded to the polycrystalline diamond body.

In yet another aspect, embodiments disclosed herein relate to a cutting element that includes a carbide substrate; a polycrystalline diamond body attached to the carbide substrate, the polycrystalline diamond body comprising a plurality of bonded diamond crystals and a plurality of interstitial regions disposed among the bonded diamond crystals, the interstitial regions having a silicon-containing compound therein; and a $sp^3$ carbon-containing coating bonded to the polycrystalline diamond body.

In yet another aspect, embodiments disclosed herein relate to a cutting element, that includes a carbide substrate; a polycrystalline diamond body attached to the carbide substrate, the polycrystalline diamond body comprising a plurality of bonded diamond crystals and a plurality of interstitial regions disposed among the bonded diamond crystals, the polycrystalline diamond body further comprising: a first region of the diamond body extending a partial depth less than an average diamond grain size into the diamond body from at least a portion of an upper or side surface of the diamond body, the first region being substantially free of a Group VIII metal; and a second region adjacent the first region, the second region comprising the Group VIII metal; and a $sp^3$ carbon-containing coating bonded to the polycrystalline diamond body Other aspects and advantages of the invention will be apparent from the following description and the appended claims.

DETAILED DESCRIPTION

In one aspect, embodiments disclosed herein relate to diamond-like carbon (DLC) or refractory metal coatings provided on cutting elements. Particularly, embodiments disclosed herein relate to the use of Plasma Enhanced Chemical Vapor Deposition (PE-CVD), and hallow cathode PE-CVD in applying DLC as well as refractory metal coatings on cutting elements. As used herein, the term "DLC" or diamond-like carbon" refers to an amorphous carbonaceous coating that possesses a significant amount of (if not all) $sp^3$ hybridization, with a balance of $sp^2$ hybridization. While diamond is traditionally formed in a cubic crystal structure, DLC is amorphous due to the mixture of cubic and hexagonal lattice structure (mixed layer by layer) formed as a result of a high energy process (i.e., PE-CVD, among others). Thus, while DLC can contain pure $sp^3$ carbon and/or a mixture of $sp^3$ and $sp^2$ carbon, it has no long range crystalline order and is referred to as "amorphous."

Cutting elements in formed in accordance with embodiments of the present disclosure may possess a surface coating applied to a PCD body surface for enhancing the operational life and/or material properties of the cutting element. While coatings techniques conventionally rely upon chemical plating techniques, chemical vapor deposition (CVD), physical vapor deposition (PVD), vacuum deposition, arc processes, or a high velocity spray, such application techniques generally heat the cutting element to elevated temperatures. The presence of a PCD layer on a cutting element makes such manufacturing conditions (exposure to elevated temperatures) undesirable in view of the thermal instabilities that exist in polycrystalline diamond.

However, by using hollow cathode PE-CVD, these elevated temperatures during the coating process may be minimized or even avoided (to the degree experienced in conventional coating techniques). Further, when using hollow cathode PE-CVD, residual stresses may be greater when the deposition occurs on an outer surface, as compared to an inner surface. Thus, the inventors of the present application have found that incorporation of the object to be coated into a hollow tubular structure so that the object's surface "forms" a part of the inner structure of the tubular member may allow for use this lower temperature and lower residual stress-producing technique to apply a diamond-like and/or refractory metal coatings on a polycrystalline diamond table of a cutting element.

Figure 1:
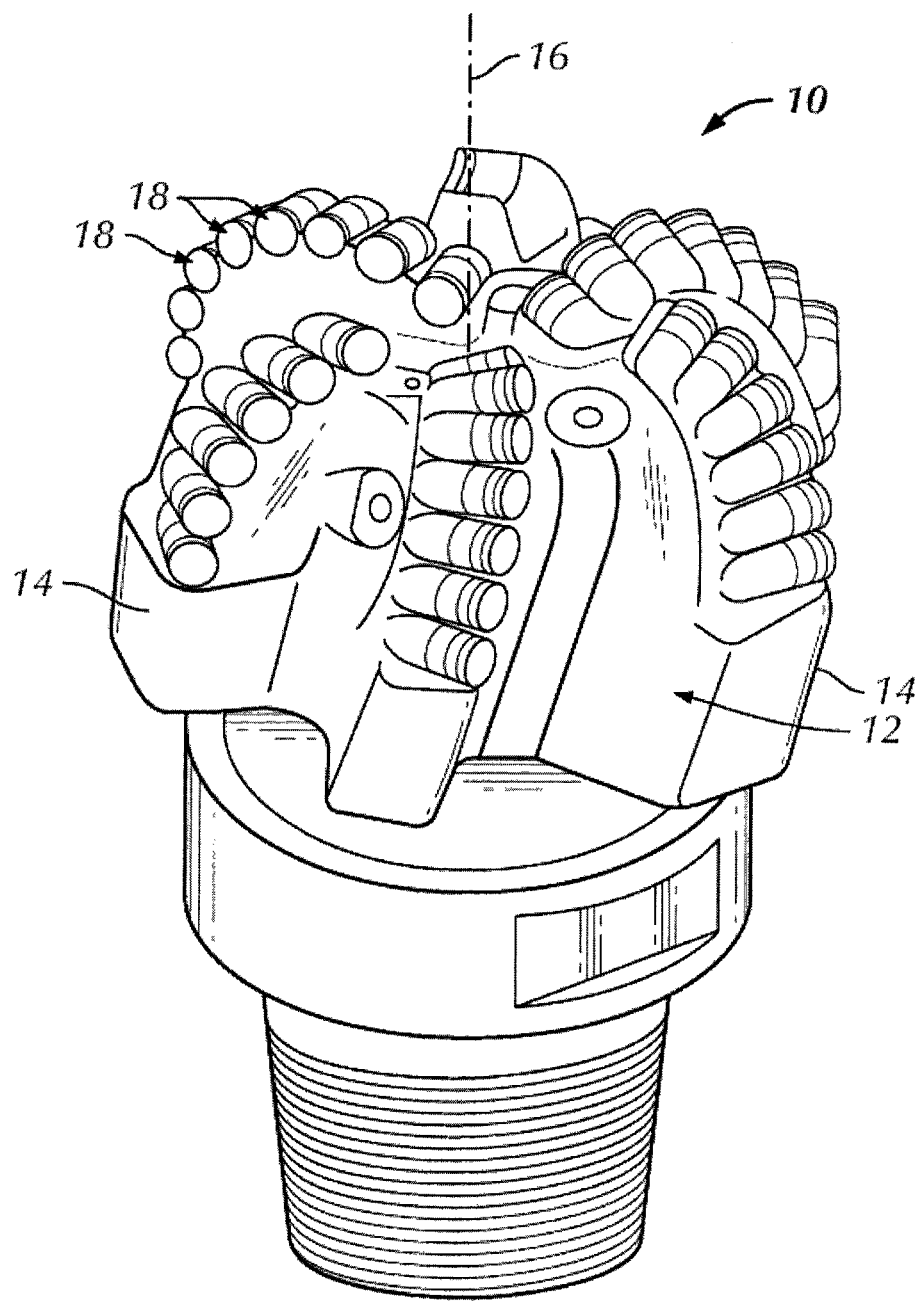
FIG. 1 shows a fixed cutter drill bit.
Figure 2A:
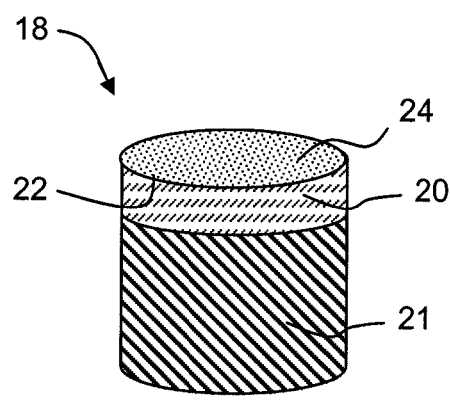
FIGS. 2A to 2F shows cutting elements according to various embodiments of the present disclosure.
Figure 2B:
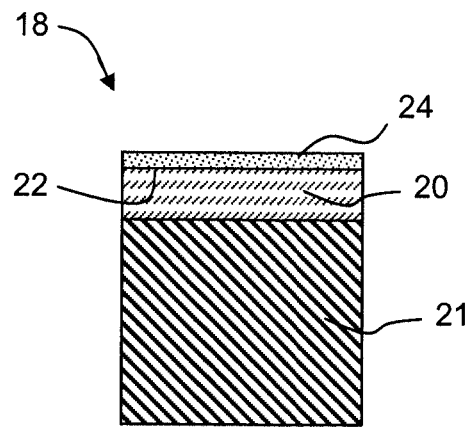

Referring to FIGS. 2A and 2B, one embodiment of a cutting element in accordance with the present application is shown. FIGS. 2A and 2B illustrate an example PCD compact 18 used in embodiments disclosed herein. The PCD compact 18 generally comprises a PCD body 8 that is bonded to a desired substrate 21. Further, as shown, on the outer surface of PCD body 20, a surface coating 24, such as a DLC, is bonded thereto. The types and details of surface coatings 24 are provided in greater details below. Although the PCD compact 18 is illustrated as being generally cylindrical in shape and having a disk-shaped flat or planar surface 22, it is understood that this is but one embodiment and that the cutting elements may be configured other than as specifically disclosed or illustrated. For example, it is within the scope of the present application that the cutting elements have a non-planar upper surface (e.g., dome, chisel, etc.), such as used as inserts for roller cone bits. The, cutting elements may be configured having an altogether different shape but generally comprise a substrate and a PCD body bonded to the substrate, wherein the PCD body (and/or substrate) is provided with working or cutting surfaces oriented as necessary to perform working or cutting service when the compact is mounted to a desired drilling or cutting device, e.g., a drill bit, including a fixed cutter bit and/or a roller cone bit.

Figure 2C:
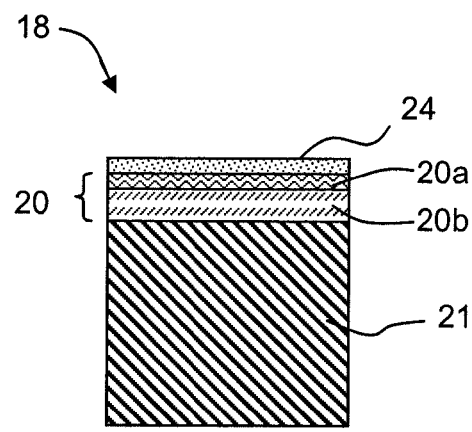
Figure 2D:
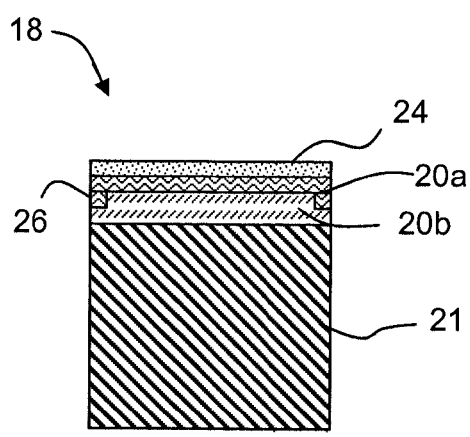
Figure 2E:
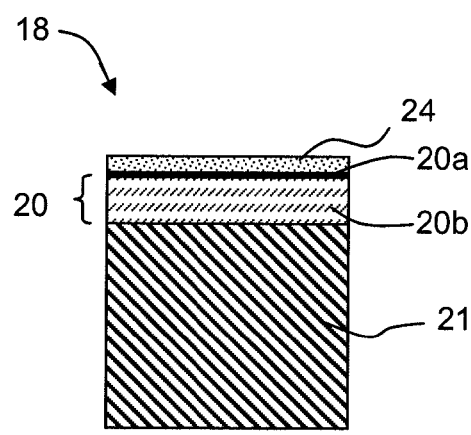
Figure 2F:
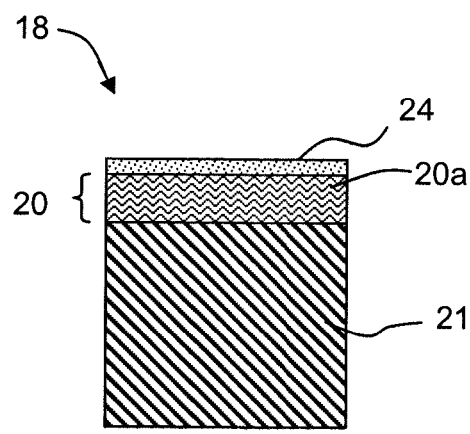

Further, while FIGS. 2A to 2B show a relatively uniform PCD body 20, various embodiments may be directed to PCD bodies 20 in which at least a portion of the catalyzing material has been removed therefrom. Specifically, FIGS. 2C to 2F illustrate alternative embodiments of PCD bodies on which surface coatings 24 may be provided. For example, FIGS. 2C and 2D illustrate PCD bodies 20 having a first region 20a from which Group VIII metals (or other catalyzing materials) may be removed, as well as a second region 20b that still possesses such Group VIII metal (or other catalyzing material). FIG. 2C shows the first region 20a extending a partial depth from the top planar surface 22 whereas FIG. 2D shows the first region 20a extending a partial depth from the top planar surface 22 as well as side surface 26. Such partial depths may range, in one embodiment, from 0.02 to less than 0.09 microns, but may extend greater depths up to, but not including, a total depth. However, in other embodiments, shown in FIG. 2E, the depth may be even less than 0.02 microns, in particular, less than the average diamond grain size, or as shown in FIG. 2F, the PCD body 20 may have substantially all Group VIII metal (or other catalyzing material removed therefrom).

Deposition Process and System

The operation of hollow cathode PE-CVD uses a hollow tubular member to create a vacuum chamber; however the hollow tubular member isn't only a vacuum chamber, but also serves as the cathode, eliminating the need for inserting electrodes into the tubular member.

Figure 3:
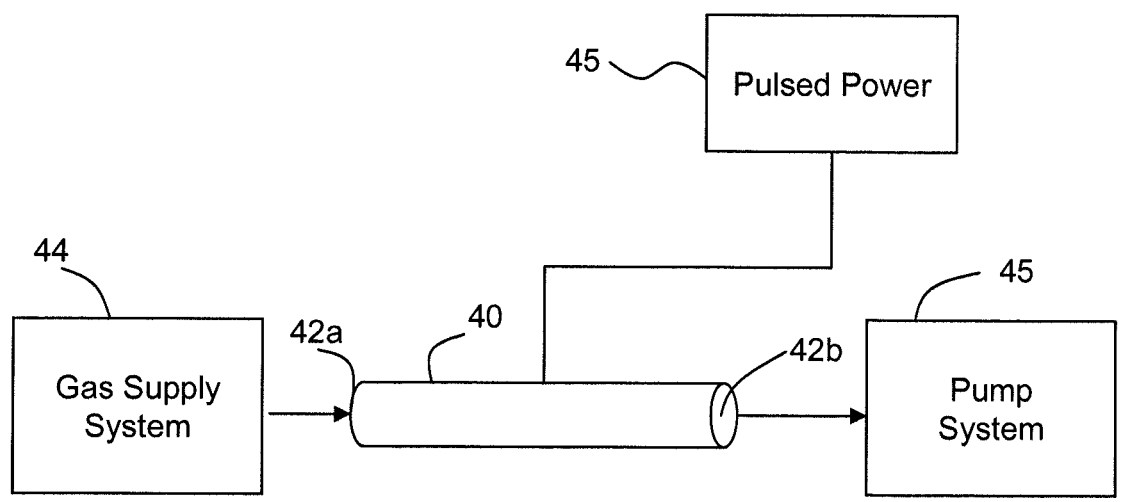
FIG. 3 shows a schematic of a hollow cathode plasma enhanced chemical vapor deposition system.

Referring to FIG. 3, a schematic of a deposition system is shown. As shown in

FIG. 3, the deposition technique operates by using a hollow tubular member 40 as the vacuum chamber as well as cathode. At one end of the hollow tubular member 40, a first anode 42a resides, with a second anode 42b residing at the other end (both insulated from tubular 40). A gas supply system 44 is connected to first anode 42a to supply source gas while a pumping system 45 is connected to a second anode 42b at the exhaust end of the tubular 40 to draw gas through the tubular member 40. A DC pulsed power supply 46 is used to apply a negative bias to the tubular 40. This bias is used to (a) create a plasma between a cathode (tubular 40) and a grounded anode (42a, 42b), (b) draw an ionized reactive gas to the surfaces of tubular 40 to be coated, (c) allow ion bombardment of the film to improve film properties such as density and stress levels, and (d) allow control of film uniformity by adjusting duty cycle so as to permit replenishment of the source gas during the "off" portion of the cycle.

Figure 4:
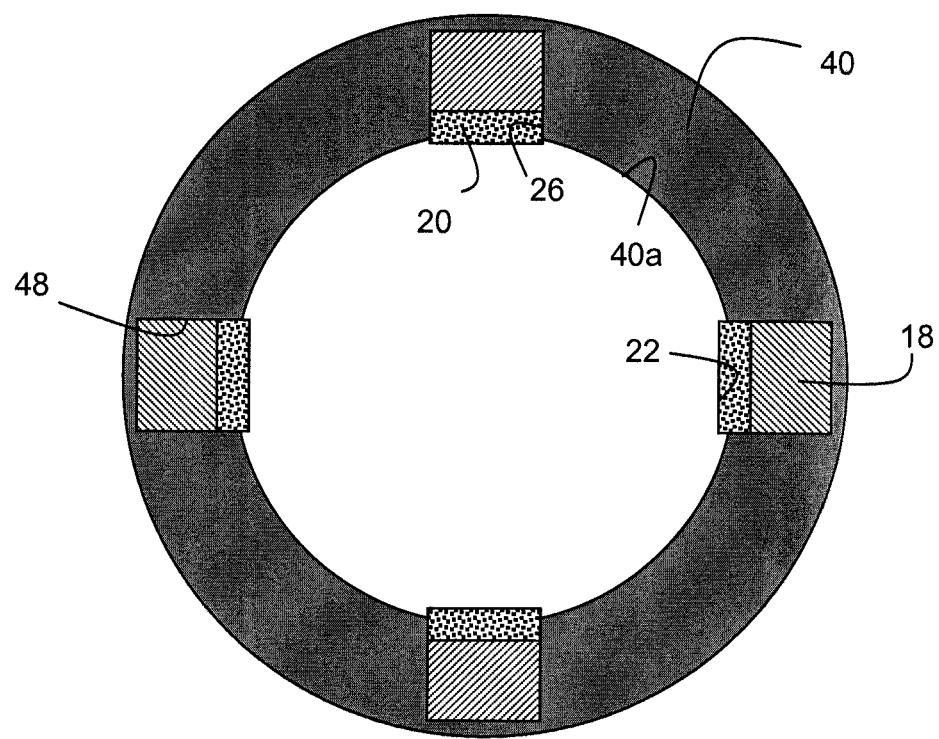
FIG. 4 shows a schematic of a tubular fixture for holding cutting elements in accordance with embodiments disclosed herein.

The gas flow and the pumping speed are adjusted such that the pressure in the tubular 40 provides a hollow cathode upon application of the voltage bias. This pressure is such that the electron mean free path is slightly less than the diameter of the tubular, causing electrons to oscillate across the tube and resulting in multiple ionizing collisions and a more intense plasma. This provides an improvement relative to prior art PECVD approaches in which plasma is generated externally from a tubular, resulting in a loss of ionization as gas flows through the tube, so that less film deposition occurs toward the exit from the tubular. In comparison, use of hollow cathode PE-CVD may achieve a more uniformly ionized plasma along the length of the tubular, thereby providing a more uniform deposition. Additional discussion of hollow cathode PE-CVD and its use in coating the inner surfaces of a pipe are found in U.S. Pat. No. 7,300,684, which is herein incorporated by reference in its entirety Referring to FIG. 4, a hollow tubular 40 serving as a fixture for several cutting elements is shown. As shown in FIG. 4, cutting elements 18 are fitted in receiving holes 48 located in spaced positions around the circumference of tubular 40. As shown in FIG. 4, cutting elements 18 are positioned such that top surface 22 of cutting element is substantially flush with the inner surface 40a of tubular 40 and exposed to the hollow region of the tubular. However, one skilled in the art would appreciate that the relative "flushness" of the cutter may depend on the both the relative size between the cutting elements 18 and inner diameter of the tubular 40. Moreover, in some embodiments, the cutting elements 18 (as well as holes 48) may be positioned so that a greater or lesser amount of cutting element 18 is exposed. For example, in some embodiments, in addition to coating the top surface 22 of PCD body 20 of cutting element 18, it may also be desirable to coat at least a portion of the side surface 26 of the PCD body 20. Further, while FIG. 4 shows cutting elements 18 fitting in holes 48 formed in tubular 40, it alternative embodiments, cutting elements 18 may be temporarily affixed to the inner surface without being received in holes 48. In such an instance, it may be desirable to provide a masking component on portions of cutting elements 18 that should remain uncoated (to prevent degradation of braze strength, for example).

Referring back to FIG. 3, gas supply provides a gaseous source that is deposited (and converted) during ionization to the desired coating. In principle, any metal, ceramic or DLC coating can be applied that has the desired properties of hardness, corrosion resistance, adhesion (e.g., TiN, CrN, SiC, etc.). To apply a DLC, a carbon precursor such as methane, acetylene, butane, toluene, etc, is used as the source gas. Properties of the coating be tailored by adjusting the $sp^3$ (diamond), $sp^2$ (graphite) and $sp^1$ (linear) bonding hybridization ratios in the coating, by varying the source gas and hydrogen content. For example, the highest $sp^3$ ratio (most diamond-like) is obtained by methane, but this also may produce a lower deposition rate compared to higher carbon molecules and also a higher compressive stress, limiting film thickness to approximately 5000 Angstroms. The addition of certain dopants (e.g., silicon or silicon oxide) to the DLC matrix may improve thermal stability and may reduce compressive stress. An organic-based precursor, such as hexemethyldisiloxane can be mixed with the hydrocarbon precursor (s) to introduce these dopants.

If other refractory metal coatings, such as non-diamond refractory silicides, aluminides, borides, carbides, nitrides, borides, oxides, or carbonitrides are desired, the source gas may be selected as known to those skilled in the art of CVD. Additionally, it is also within the scope of the present disclosure that a refractory metal dopant may be provided in the DLC coating to vary the properties of the coating, such as electrical conductivity.

Coating properties may thus be tailored by selection of the precursor gas. Additionally, it is also within the scope of the present disclosure that multiple layers of coatings may be deposited. For example, if it is necessary for a particular process (e.g., very rough welds) to have a thick deposited coating, the above process can be modified by deposition of a thin methane-based layer, followed by the use of a higher deposition rate, lower stress precursors such as toluene, or by higher energy ion bombardment to increase adhesion and reduce stress. Alternatively, depending on the substrate material onto which the coating is being deposited, several layers may be desired to promote adhesion. The coating deposited may depend on the number of layers, but may generally be less than 100 microns. In some particular examples, the coatings may range from 5 to 50 microns in thickness.

A further advantage of the invention is that a multi-step process may be used to tailor the coating qualities deposited on the internal surface of the tubular. The surface of the tubular may also be pre-cleaned by the introduction of a sputtering gas such as Ar in the first step of the method, following pump down to $1\times10^{-3}$ to $1\times10^{-4}$ Ton pressure Contaminants on the interior surface of the tubular (and cutting elements) may be sputtered off when the negative DC pulse is applied. A second step may then be performed using carbon implantation (by increasing the magnitude of the bias to greater than 5 kV) to form a subsurface carbon layer, which may improve the adhesion of the DLC.

Following this implantation step, DLC deposition steps may be performed using the above-mentioned methane, acetylene or toluene, etc. precursors. The DC pulse voltage may be reduced in this process step to provide thin film deposition instead of implantation (e.g., 100 V-10 kV). Further, to control sputtering versus deposition rate and thus provide a more uniform coating down the tubular (and on the cutting elements), coating material is continuously sputtered off the entrance portion of the tube, wherein the sputtered material is drawn by flow velocity toward the rear end of the tube. Uniformity may also controlled by the duty cycle of the DC pulse, such that when the pulse is "off," the source gas is allowed to replenish and flow down the tube. One skilled in the art will recognize that uniformity is also controlled by the selections of the gas flow rate and the pumping speed.

Forming Polycrystalline Abrasive Bodies

As used herein, the term "PCD" refers to polycrystalline diamond that has been formed, at high pressure/high temperature (HPHT) conditions, through the use of a solvent metal catalyst, such as those included in Group VIII of the Periodic table. However, the present disclosure is also directed to polycrystalline cubic boron nitride (formed from subjecting boron nitride particles to HPHT conditions) as well as thermally stable polycrystalline diamond.

A polycrystalline diamond body may be formed in a conventional manner, such as by a high pressure, high temperature sintering of "green" particles to create intercrystalline bonding between the particles. "Sintering" may involve a high pressure, high temperature (HPHT) process. Examples of high pressure, high temperature (HPHT) process can be found, for example, in U.S. Pat/ Nos. 4,694,918; 5,370,195; and 4,525,178. Briefly, to form the polycrystalline diamond object, an unsintered mass of diamond crystalline particles is placed within a metal enclosure of the reaction cell of a HPHT apparatus. A suitable HPHT apparatus for this process is described in U.S. Pat. Nos. 2,947,611; 2,941,241; 2,941,248; 3,609,818; 3,767,371; 4,289,503; 4,673,414; and 4,954,139. A metal catalyst, such as cobalt or other Group VIII metals, may be included with the unsintered mass of crystalline particles to promote intercrystalline diamond-to-diamond bonding. The catalyst material may be provided in the form of powder and mixed with the diamond grains, or may be infiltrated into the diamond grains during HPHT sintering An exemplary minimum temperature is about 1200° C. and an exemplary minimum pressure is about 35 kilobars. Typical processing is at a pressure of about 45 kbar and 1300° C. Those of ordinary skill will appreciate that a variety of temperatures and pressures may be used, and the scope of the present invention is not limited to specifically referenced temperatures and pressures.

Diamond grains useful for forming a polycrystalline diamond body may include any type of diamond particle, including natural or synthetic diamond powders having a wide range of grain sizes. For example, such diamond powders may have an average grain size in the range from submicrometer in size to 100 micrometers, and from 1 to 80 micrometers in other embodiments. Further, one skilled in the art would appreciate that the diamond powder may include grains having a mono- or multi-modal distribution.

Moreover, the diamond powder used to prepare the PCD body may be synthetic diamond powder or natural diamond powder. Synthetic diamond powder is known to include small amounts of solvent metal catalyst material and other materials entrained within the diamond crystals themselves. Unlike synthetic diamond powder, natural diamond powder does not include such solvent metal catalyst material and other materials entrained within the diamond crystals. It is theorized that that inclusion of materials other than the solvent catalyst in the synthetic diamond powder can operate to impair or limit the extent to which the resulting PCD body can be rendered thermally stable, as these materials along with the solvent catalyst must also be removed or otherwise neutralized. Because natural diamond is largely devoid of these other materials, such materials do not have to be removed from the PCD body and a higher degree of thermal stability may thus be obtained. Accordingly, for applications calling for a particularly high degree of thermal stability, one skilled in the art would appreciate that the use of natural diamond for forming the PCD body may be preferred. The diamond grain powder, whether synthetic or natural, may be combined with or already includes a desired amount of catalyst material to facilitate desired intercrystalline diamond bonding during HPHT processing. Suitable catalyst materials useful for forming the PCD body include those solvent metals selected from the Group VIII of the Periodic table, with cobalt (Co) being the most common, and mixtures or alloys of two or more of these materials. In a particular embodiment, the diamond grain powder and catalyst material mixture may comprise 85 to 95% by volume diamond grain powder and the remaining amount catalyst material. Alternatively, the diamond grain powder can be used without adding a solvent metal catalyst in applications where the solvent metal catalyst can be provided by infiltration during HPHT processing from the adjacent substrate or adjacent other body to be bonded to the PCD body.

The diamond powder may be combined with the desired catalyst material, and the reaction cell is then placed under processing conditions sufficient to cause the intercrystalline bonding between the diamond particles. The PCD body can be formed with or without having a substrate material bonded thereto. In the event that the formation of a PCD compact comprising a substrate bonded to the PCD body is desired, a selected substrate is loaded into the container adjacent the diamond powder mixture prior to HPHT processing. An advantage of forming a PCD compact having a substrate bonded thereto is that it enables attachment of the to-be-formed cutting element to a desired wear or cutting device (i.e., bit or other cutting tool) by conventional methods, e.g., brazing or welding. Additionally, in the event that the PCD body is to be bonded to a substrate, and the substrate includes a metal solvent catalyst, the metal solvent catalyst needed for catalyzing intercrystalline bonding of the diamond may be provided by infiltration, in which case is may not be necessary to mix the diamond powder with a metal solvent catalyst prior to HPHT processing.

Suitable materials useful as substrates for forming PCD compacts of this invention include those conventionally used as substrates for conventional PCD compacts, such as those formed from metallic and cermet materials. In a preferred embodiment, the substrate is provided in a preformed state and includes a metal solvent catalyst that is capable of infiltrating into the adjacent diamond powder mixture during processing to facilitate and provide a bonded attachment therewith. Suitable metal solvent catalyst materials include those selected from Group VIII elements of the Periodic table. A particularly preferred metal solvent catalyst is cobalt (Co). In a preferred embodiment, the substrate material comprises cemented tungsten carbide (WC—Co).

In an example embodiment, the device is controlled so that the container is subjected to a HPHT process comprising a pressure in the range of from 5 to 7 GPa and a temperature in the range of from about 1320 to 1600° C., for a sufficient period of time. During this HPHT process, the catalyst material in the mixture melts and infiltrates the diamond grain powder to facilitate intercrystalline diamond bonding. During the formation of such intercrystalline diamond bonding, the catalyst material may migrate into the interstitial regions within the microstructure of the so-formed PCD body that exists between the diamond bonded grains It should be noted that if too much additional non-diamond material is present in the powdered mass of crystalline particles, appreciable intercrystalline bonding is prevented during the sintering process. Such a sintered material where appreciable intercrystalline bonding has not occurred is not within the definition of PCD. Following such formation of intercrystalline bonding, a polycrystalline diamond body may be formed that has, in one embodiment, at least about 80 percent by volume diamond, with the remaining balance of the interstitial regions between the diamond grains occupied by the catalyst material. In other embodiments, such diamond content may comprise at least 85 percent by volume of the formed diamond body, and at least 90 percent by volume in yet another embodiment. However, one skilled in the art would appreciate that other diamond densities may be used in alternative embodiments. Thus, the polycrystalline diamond bodies being used in accordance with the present disclosure include what is frequently referred to in the art as "high density" polycrystalline diamond. Further, one skilled in the art would appreciate that, frequently, a diamond layer is sintered to a carbide substrate by placing the diamond particles on a preformed substrate in the reaction cell and sintering.

Once formed, the PCD body or compact may be optionally treated to render a selected region thereof thermally stable, whereby catalyst materials in the interstitial spaces between bonded diamond grains subjected to a leaching process to effectuate the removal of the catalyst material from the PCD body. This can be done, for example, by removing substantially all of the catalyst material from the selected region by suitable process, e.g., by acid leaching, aqua regia bath, electrolytic process, or combinations thereof. As used herein, the term "removed" refers to the reduced presence of catalyst material in the PCD body, and is understood to mean that a substantial portion of the catalyst material no longer resides in the PCD body. However, one skilled in the art would appreciate that various amounts of catalyst material may still remain in the microstructure of the PCD body within the interstitial regions and/or adhered to the surface of the diamond grains.

Alternatively, rather than actually removing the catalyst material from the PCD body or compact, the selected region of the PCD body or compact can be rendered thermally stable by treating the catalyst material in a manner that reduces or eliminates the potential for the catalyst material to adversely impact the intercrystalline bonded diamond at elevated temperatures. For example, the catalyst material can be combined chemically with another material to cause it to no longer act as a catalyst material, or can be transformed into another material that again causes it to no longer act as a catalyst material. Accordingly, as used herein, the terms "removing" as used in reference to the catalyst material is intended to cover the different methods in which the catalyst material can be treated to no longer adversely impact the intercrystalline diamond in the PCD body or compact with increasing temperature.

Further, as mentioned above, depending on the particular application of the cutting element, as well as the material properties desired, the catalyzing material may be removed from select regions of the diamond body. For example, removal may occur by "etching" in which the catalyzing material is only removed from a minimal volume of the diamond body. In particular, as used herein, etching refers to removal of catalyzing material from a region extending from an outer surface (top and/or side surface) to a depth less than an average diamond grain size. Other embodiments may provide for partial removal, i.e., removal of catalyzing material from a region extending a partial depth from an outer surface (top and/or side surface), which may range in various embodiments from 0.02 to less than 0.09 microns or greater than 0.09 microns to less than a total depth in other embodiments. Additionally, it is also within the scope of the present disclosure that removal of the catalyzing material may occur from substantially the entire PCD body.

A conventional leaching process involves the exposure of an object to be leached with a leaching agent, such as described in U.S. Pat. No. 4,224,380, which is herein incorporated by reference in its entirety. In select embodiments, the leaching agent may be a weak, strong, or mixtures of acids. In other embodiments, the leaching agent may be a caustic material such as NaOH or KOH. Suitable acids may include, for example, nitric acid, hydrofluoric acid, hydrochloric acid, sulfuric acid, phosphoric acid, or perchloric acid, or combinations of these acids. In addition, caustics, such as sodium hydroxide and potassium hydroxide, have been used to the carbide industry to digest metallic elements from carbide composites. In addition, other acidic and basic leaching agents may be used as desired. Those having ordinary skill in the art will appreciate that the molarity of the leaching agent may be adjusted depending on the time desired to leach, concerns about hazards, etc. Further, electrochemical leaching methods may also be used.

However, while some PCD bodies may have been leached prior to the application of the surface coatings disclosed here, other PCD bodies may contain all or substantially all catalyzing material therein. Further, in addition to Group VIII metals being used as the catalyzing materials, it is also within the scope of the present disclosure that the catalyzing material used to promote intercrystalline bonding between diamond crystals also include more thermally similar materials such as silicon-based compounds, including pure silicon and silicon carbide, which may be used alone or in combination with conventional Group VIII catalyzing materials. Use of silicon-based compounds in forming PCD is described, for example, in U.S. Patent Publication No. 2005/0230156, which is assigned to the present assignee and herein incorporated by reference in its entirety.

Further, one skilled in the art would appreciate that the same techniques used with polycrystalline diamond may be applied to polycrystalline cubic boron nitride (PCBN). Similar to polycrystalline diamond, PCBN may be formed by sintering boron nitride particles (typically CBN) via a HPHT process, similar to those for PCD, to sinter "green" particles to create intercrystalline bonding between the particles. CBN refers to an internal crystal structure of boron atoms and nitrogen atoms in which the equivalent lattice points are at the corner of each cell. Boron nitride particles typically have a diameter of approximately one micron and appear as a white powder. Boron nitride, when initially formed, has a generally graphite-like, hexagonal plate structure. When compressed at high pressures (such as 106 psi), CBN particles will be formed with a hardness very similar to diamond, and a stability in air at temperatures of up to 1400° C.

According to one embodiment of the invention, PCBN may include a content of boron nitride of at least 50% by volume; at least 70% by volume in another embodiment; at least 85% by volume in yet another embodiment. In another embodiment, the cubic boron nitride content may range from 50 to 80 percent by volume, and from 80 to 99.9 percent by volume in yet another embodiment. The residual content of the polycrystalline cubic boron nitride composite may include at least one of Al, Si, and mixtures thereof, carbides, nitrides, carbonitrides and borides of Group IVa, Va, and VIa transition metals of the periodic table. Mixtures and solid solutions of Al, Si, carbides, nitrides, carbonitrides and borides of Group IVa, Va, and VIa transition metals of the periodic table may also be included.

Embodiments of the present disclosure may provide for at least one of the following advantages. A diamond-like carbon coating provided on a cutting element surface may provide various beneficial material properties. For example, while not quick as hard as a pure cubic form of diamond, the difference is minimal. However, DLC may possess certain advantages over polycrystalline diamond (formed with a Group VIII catalyzing material), in particular related to the thermal degradation properties (due to the absence of a Group VIII metal in the coating). Further, because DLC does not possess long range order, there are no brittle fracture planes, so such coatings are flexible and conformal to the underlying shape being coated, while still being substantially as hard as diamond. Additionally, use the hollow cathode PE-CVD may provide a DLC with reduced residual stresses as compared to other deposition techniques.

Additionally, while leaching may provide means for removing Group VIII metals from a polycrystalline diamond material, in some instances, the cobalt may be desirable in some regions of the diamond body to minimize negative impact on other properties such as impact strength. Thus, by using a DLC coating of the present disclosure, a greater depth of a "Group VIII metal-free" region may be obtained without leaching the metal to that entire depth. Further, use of hollow-cathode PE-CVD techniques may allow for the deposition of such coatings with minimal exposure of the cutting elements to elevated temperatures. For example, maximum temperatures experienced by the cutting elements may be far less than 400° C., and may be about 175° C. in some examples.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed:

1. A method of forming a cutting element, comprising:
    placing at least one cutting element at an inner surface of at least one hollow tubular member such that at least a portion of the at least one cutting element is exposed, wherein the at least one cutting element is positioned such that a top surface of at least one cutting element is substantially flush with the inner surface of the at least one hollow tubular member;
    generating plasma within the hollow portion of the tubular; and
    depositing at least one refractory metal or $sp^3$ carbon-containing coating on an exposed surface of the at least one cutting element.

2. The method of claim 1, wherein the generating plasma comprises:
    attaching anodes to openings of the at least one hollow tubular member;
    negatively pulse biasing the at least one hollow tubular member; and
    introducing and ionizing at least one gaseous coating precursor to the hollow portion.

3. The method of claim 1, wherein the $sp^3$ carbon-containing coating comprises at least partial $sp^3$ hybridization.

4. The method of claim 3, wherein the carbon-based coating comprises a mixture of $sp^2$ and $sp^3$ hybridization.

5. The method of claim 1, wherein the refractory metal coating comprises a non-diamond refractory silicide, aluminide, boride, carbide, nitride, oxide, or carbonitride.

6. The method of claim 1, wherein the depositing comprises:
    depositing a silicon carbide coating on an exposed surface of the at least one cutting element; and
    depositing a $sp^3$ carbon-containing coating on the silicon carbide coating.

7. The method of claim 1, wherein the placing comprises fitting the at least one cutting element in receiving holes in the at least one hollow tubular such that only a portion of the cutting element extends beyond an inner surface of the at least one hollow tubular member.

8. The method of claim 1, wherein the placing comprises affixing a bottom surface of the at least one cutting element to an inner surface of the at least one hollow tubular member.

9. The method of claim 2, further comprising:
    selecting the at least one gaseous coating precursor based on resulting coating properties.

* * * * *